(12) United States Patent
Kamineni et al.

(10) Patent No.: US 8,889,500 B1
(45) Date of Patent: Nov. 18, 2014

(54) METHODS OF FORMING STRESSED FIN CHANNEL STRUCTURES FOR FINFET SEMICONDUCTOR DEVICES

(71) Applicant: GLOBALFOUNDRIES Inc., Grand Cayman (KY)

(72) Inventors: Vimal K. Kamineni, Albany, NY (US); Derya Deniz, Troy, NY (US); Abner Bello, Clifton Park, NY (US); Abhijeet Paul, Albany, NY (US); Robert J. Miller, Yorktown Heights, NY (US); William J. Taylor, Jr., Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/960,244

(22) Filed: Aug. 6, 2013

(51) Int. Cl.
*H01L 21/338* (2006.01)
*H01L 29/78* (2006.01)
*H01L 29/66* (2006.01)

(52) U.S. Cl.
CPC ........ *H01L 29/66795* (2013.01); *H01L 29/785* (2013.01)
USPC ........... 438/176; 438/283; 438/151; 257/365; 257/268; 257/E29.264

(58) Field of Classification Search
CPC .................. H01L 29/66795; H01L 29/785
USPC .......... 257/365, 347, 288, E29.264, E21.421, 257/E29.255, 192, 401, E21.19, E21.409, 257/E27.06, E29.242, E29.056; 438/283, 438/197, 268, 151, 157, 478, 303
See application file for complete search history.

(56) References Cited

U.S. PATENT DOCUMENTS

| 8,124,531 B2 | 2/2012 | Chandrashekar et al. |
| 2011/0062518 A1* | 3/2011 | Chan et al. .................... 257/347 |

* cited by examiner

*Primary Examiner* — Kevin M Picardat
*Assistant Examiner* — Paul Patton
(74) *Attorney, Agent, or Firm* — Amerson Law Firm, PLLC

(57) ABSTRACT

One illustrative method disclosed herein includes, among other things, forming a plurality of fin-formation trenches that define a fin, forming a first stressed layer within the trenches and above the fin and performing at least one etching process on the first stressed layer so as to define spaced-apart portions of the first stressed layer positioned at least partially within the trenches on opposite sides of the fin. The method also includes forming spaced-apart portions of a second stressed layer above the spaced-apart portions of the first layer, forming a third stressed layer above the fin between the spaced-apart portions of the second layer and, after forming the third layer, forming a conductive layer above the second and third layers.

22 Claims, 9 Drawing Sheets

METHODS OF FORMING STRESSED FIN CHANNEL STRUCTURES FOR FINFET SEMICONDUCTOR DEVICES

BACKGROUND OF THE INVENTION

1. Field of the Invention

Generally, the present disclosure relates to the manufacture of semiconductor devices, and, more specifically, to various methods of forming stressed fin channel structures for FinFET semiconductor devices and to FinFET devices having such stressed fin structures.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A FET is a planar device that typically includes a source region, a drain region, a channel region that is positioned between the source region and the drain region, and a gate electrode positioned above the channel region. Current flow through the FET is controlled by controlling the voltage applied to the gate electrode. If the voltage applied to the gate electrode is less than the threshold voltage of the device, then there is no current flow through the device (ignoring undesirable leakage currents, which are relatively small). However, when a voltage that is equal to or greater than the threshold voltage is applied to the gate electrode, the channel region becomes conductive, and electrical current is permitted to flow between the source region and the drain region through the conductive channel region.

To improve the operating speed of FETs, and to increase the density of FETs on an integrated circuit device, device designers have greatly reduced the physical size of FETs over the past decades. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently prevent the electrical potential of the source region and the channel from being adversely affected by the electrical potential of the drain. This is sometimes referred to as a so-called short channel effect, wherein the characteristic of the FET as an active switch is degraded.

In contrast to a FET, which has a planar structure, a so-called FinFET device has a three-dimensional (3D) structure. FIG. 1A is a perspective end view of a reference FinFET semiconductor device "A" that is formed above a semiconductor substrate "B." FIG. 1B is a cross-sectional view of the FinFET device taken where indicated in FIG. 1A. The device A includes a plurality of fins "C," a schematically depicted gate structure "D," sidewall spacers "E" and a gate cap layer "F." In a conventional process flow, the portions of the fins C that are positioned in the source/drain regions may be increased in size or even merged together (not shown in FIG. 1A) by performing one or more epitaxial growth processes. With reference to FIG. 1B, the gate structure D may include a so-called high-k gate insulation layer D1, and a plurality of conductive materials that serve as the gate electrode of the device, e.g., a work-function adjusting metal layer D2 and one or more additional conductive gate electrode materials D3.

In a FinFET device, the gate structure D encloses both sides and an upper surface of the fins C to form a tri-gate structure so as to use a channel having a three-dimensional structure instead of a planar structure. In some cases, an insulating fin cap layer (not shown), e.g., silicon nitride, is positioned at the top of the fins C, and the FinFET device A only has a dual-gate structure. Unlike a planar FET, in a FinFET device, a channel is formed perpendicular to a surface of the semiconducting substrate B so as to reduce the physical size of the semiconductor device. The proximity of the two gates also provides an improvement in the control of the channel electrical parameters. Also, in a FinFET, the junction capacitance at the drain region of the device is greatly reduced, which tends to reduce at least some short channel effects. When an appropriate voltage is applied to the gate electrode of the FinFET device A, the surfaces (and the inner portion near the surface) of the fins C, i.e., the substantially vertically oriented sidewalls and the top upper surface of the fins C, become populated with inversion carriers, which contribute to current conduction. In a FinFET device, the "channel-width" is approximately two times (2×) the vertical fin-height plus the width of the top surface of the fin, i.e., the fin width. Multiple fins can be formed in the same foot-print as that of a planar transistor device. Accordingly, for a given plot space (or foot-print), FinFETs tend to be able to generate significantly stronger drive currents than planar transistor devices. Additionally, the leakage current of FinFET devices after the device is turned "OFF" is significantly reduced as compared to the leakage current of planar FETs, due to the superior gate electrostatic control of the "fin" channel on FinFET devices. In short, the 3D structure of a FinFET device is a superior MOSFET structure as compared to that of a planar FET, especially in the 20 nm CMOS technology node and beyond.

When forming semiconductor devices in a substrate, isolation regions, such as so-called shallow trench isolation (STI) regions, are typically formed in the substrate and filled with an insulating material so as to electrically isolate adjacent semiconductor devices. One process flow that is typically performed to form FinFET devices involves forming a plurality of trenches in the substrate to define the areas where STI regions will be formed and to define the initial structure of the fins. These trenches are typically formed in the substrate during the same process operation for processing simplicity. The trenches have a target depth that is sufficient for the needed fin height and deep enough to allow formation of an effective STI region. After the trenches are formed, a layer of insulating material, such as silicon dioxide, is formed so as to overfill the trenches. Thereafter, a chemical mechanical polishing (CMP) process is then performed to planarize the upper surface of the insulating material with the top of the fins (or the top of a patterned hard mask). Next, an etch-back process is performed to recess the layer of insulating material between the fins and thereby expose the upper portions of the fins C, which corresponds to the final fin height of the fins C.

Device designers are under constant pressure to increase the operating speed and electrical performance of transistors and integrated circuit products that employ such transistors. Given that the gate length (the distance between the source and drain regions) on modern transistor devices may be approximately 20-50 nm, and that further scaling is anticipated in the future, device designers have employed a variety of techniques in an effort to improve device performance, e.g., the use of high-k dielectrics, the use of metal gate electrode structures, the incorporation of work function metals in the gate electrode structure and the use of channel stress engineering techniques on transistors (to create a tensile stress in the channel region for NFET transistors and to create a compressive stress in the channel region for PFET transistors). With respect to planar FET devices, stress engineering techniques typically involve the formation of specifically made silicon nitride layers that are selectively formed above appropriate transistors, i.e., a layer of silicon nitride that is intended to impart a tensile stress in the channel region of a NFET transistor would only be formed above the NFET transistors. Such selective formation may be accomplished by masking the PFET transistors and then blanket depositing the layer of silicon nitride, or by initially blanket depositing the layer of silicon nitride across the entire substrate and then performing an etching process to selectively remove the silicon nitride from above the PFET transistors. Conversely, for PFET transistors, a layer of silicon nitride that is intended to impart a compressive stress in the channel region of a PFET transistor is formed above the PFET transistors. The techniques employed in forming such nitride layers with the desired tensile or compressive stress are well known to those skilled in the art.

For both planar and 3D FET devices, the gate structures, i.e., the gate insulation layer(s) and the gate conductor material(s), may be formed using either so-called "gate-first" or "replacement metal gate" (RMG) techniques which are well known to those skilled in the art. In general, in a gate-first process, the materials that will constitute the gate structure are deposited above the substrate and patterned using known photolithography and etching techniques to define the final gate structure. In a replacement-gate process, an initial "dummy" gate structure is formed above the substrate and processing continues with the dummy gate structure in position, e.g., formation of source/drain regions, performing one or more heating processes, etc. At some point, the dummy gate structure is exposed and removed by performing one of more etching processes, which results in a gate cavity. Thereafter, various deposition processes are performed to deposit the materials of the "replacement gate" in the gate cavity. Additional processing operations such as a chemical mechanical polishing (CMP) and/or an etch process are performed to create the final replacement metal gate structure for the device. As indicated by its name, the replacement metal gate typically includes one or more layers of metal due to the superior performance characteristics exhibited by devices that have metal gates, e.g., improved threshold voltage and so-called "Tiny" characteristics as compared to devices using traditional silicon dioxide/polysilicon gate structures. Typically, the common work-function metals, e.g., TiN, TaC, TaN, TiC, TiAl, etc., that are used in replacement gate structures are very thin, e.g., 1-3 nm. Moreover, such work function metals are typically formed in such a manner that they exhibit a relatively low tensile stress, e.g., typically less than 400 MPa.

The present disclosure is directed to various methods of forming stressed fin channel structures for FinFET semiconductor devices and to FinFET devices having such stressed fin structures.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming stressed fin channel structures for FinFET semiconductor devices and to FinFET devices having such stressed fin structures. One illustrative method disclosed herein includes, among other things, forming a plurality of fin-formation trenches in a semiconductor substrate that define a fin having an upper surface, forming a first stressed conductive material layer within the trenches and above the upper surface of the fin and performing at least one etching process on the first stressed conductive material layer so as to define spaced-apart portions of the first stressed conductive material layer positioned at least partially within the trenches on opposite sides of the fin. In this embodiment, the method also includes, after performing the etching process, performing a selective deposition process to selectively form spaced-apart portions of a second stressed conductive material layer above the spaced-apart portions of the first stressed conductive material layer, forming a third stressed conductive material layer above the upper surface of the fin between the spaced-apart portions of the second stressed conductive material layer and, after forming the third stressed conductive material layer, forming a conductive layer above the second stressed conductive material layer and the third stressed conductive material layer.

Another illustrative method disclosed herein includes, among other things, forming a plurality of fin-formation trenches in a semiconductor substrate so as to define a fin having an upper surface, forming a first stressed conductive material layer (having a first stress) within the trenches and above the upper surface of the fin and performing at least one etching process on the first stressed conductive material layer so as to define spaced-apart portions of the first stressed conductive material layer positioned at least partially within the trenches on opposite sides of the fin. In this embodiment, the method also includes, after performing the etching process, performing a selective deposition process to selectively form spaced-apart portions of a second stressed conductive material layer (having a second stress) above the spaced-apart portions of the first stressed conductive material layer, forming a third stressed conductive material layer (having a third stress) above the upper surface of the fin between the spaced-apart portions of the second stressed conductive material layer and, after forming the third stressed conductive material layer, forming a conductive layer above the second stressed conductive material layer and the third stressed conductive material layer.

Yet another illustrative method disclosed herein includes, among other things, forming a plurality of fin-formation trenches in a semiconductor substrate so as to define a fin having an upper surface, forming a first tensile stressed conductive material layer comprised of fluorine-containing tungsten within the trenches and above the upper surface of the fin and performing at least one etching process on the first stressed conductive material layer so as to define spaced-apart portions of the first stressed conductive material layer positioned at least partially within the trenches on opposite sides of the fin. In this embodiment, the method also includes, after performing the etching process, performing a selective deposition process to selectively form spaced-apart portions of a second tensile stressed conductive material layer comprised of fluorine-containing tungsten above the spaced-apart portions of the first stressed conductive material layer, forming a third compressively stressed conductive material layer comprised of substantially fluorine-free tungsten above the upper surface of the fin between the spaced-apart portions of the second stressed conductive material layer and, after forming the third stressed conductive material layer, forming a conductive layer above the second stressed conductive material layer and the third stressed conductive material layer.

BRIEF DESCRIPTION OF THE DRAWINGS

The disclosure may be understood by reference to the following description taken in conjunction with the accompanying drawings, in which like reference numerals identify like elements, and in which.

Figure 1A:
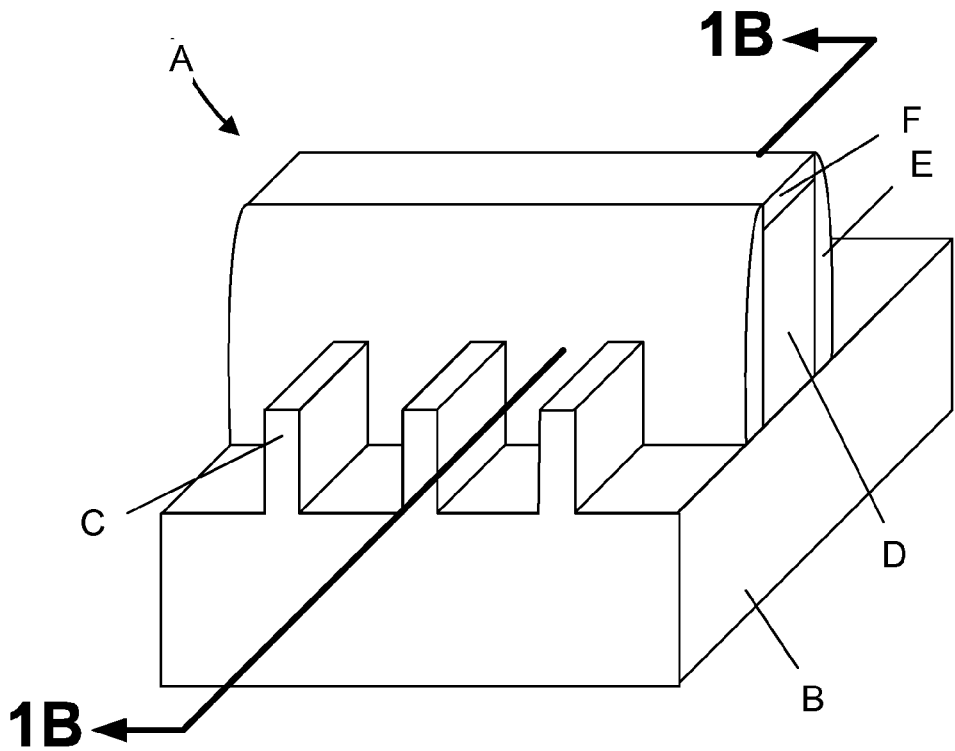
FIGS. 1A-1B depict one illustrative prior art FinFET device.
Figure 1B:
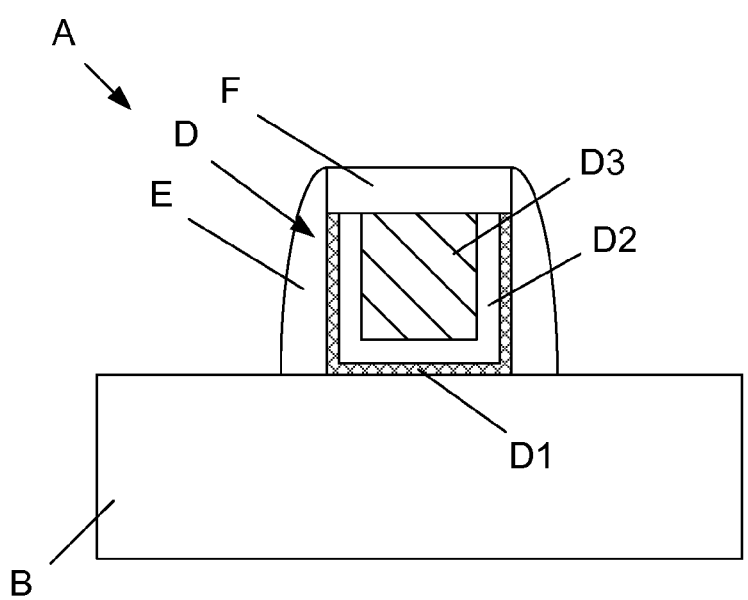

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In general, the present disclosure is directed to various methods of forming stressed fin channel structures for FinFET semiconductor devices and to FinFET devices having such stressed fin channel structures. Moreover, as will be readily apparent to those skilled in the art upon a complete reading of the present application, the present method is applicable to a variety of devices, including, but not limited to, logic devices, memory devices, etc., and the methods disclosed herein may be employed to form N-type and/or P-type FinFET devices. With reference to the attached figures, various illustrative embodiments of the methods and devices disclosed herein will now be described in more detail. FIGS. 3A-3G and 4A-4G discussed below are cross-sectional views taken through the gate structure of the device in a direction that is parallel to the long axis of the gate structure, i.e., in the gate width direction of the device. Note that the drawings herein are not to scale and that the relative size of the features depicted herein may be exaggerated so as to facilitate explanation of the various inventions disclosed herein.

Figure 2:
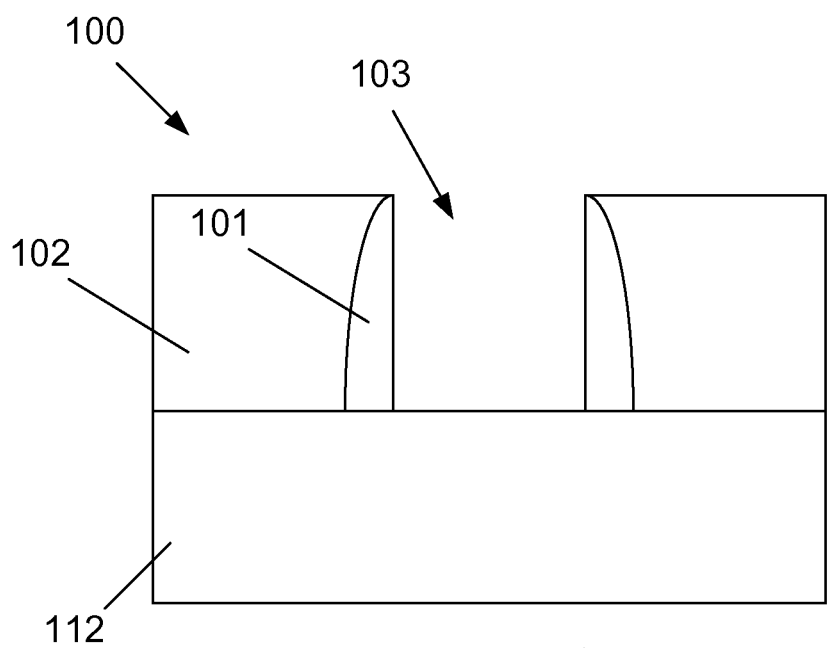
FIG. 2 is a cross-sectional view of an illustrative embodiment of a device disclosed herein at a point in fabrication wherein a dummy gate structure has been removed and a gate cavity has been defined where a replacement gate structure will be formed using the methods disclosed herein.

The view in FIG. 2 is a cross-sectional view of the gate area of the device 100 (taken between the fins (not shown in FIG. 2)) disclosed herein at a point in fabrication wherein several process operations have been performed prior to the actual steps of forming the replacement gate structure. Importantly, at the point of processing depicted in FIG. 2, a dummy gate structure (not shown) has been removed so as to thereby define a gate cavity 103 defined by spacers 101. An illustrative layer of insulating material 102 has also been formed at this point in the typical replacement gate process. The methods described below are directed to forming a replacement gate structure in the gate cavity 103.

Figure 3A:
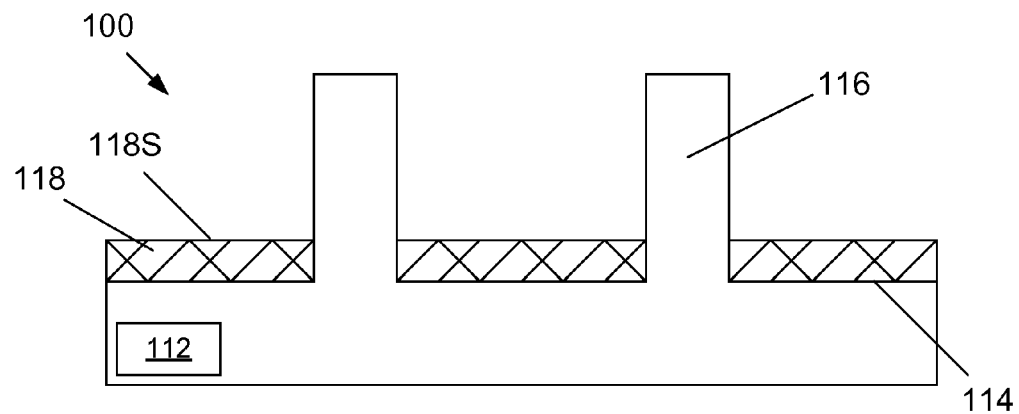
FIGS. 3A-3G depict one illustrative method disclosed herein for forming stressed fin channel structures for FinFET semiconductor devices and an illustrative example of a FinFET device comprised of such a stressed fin channel structure.

FIGS. 3A-3G depict one illustrative method disclosed herein for forming stressed fin channel structures for FinFET semiconductor devices and to an illustrative example of a FinFET device 100 having such a stressed fin channel structure. In the example depicted in FIGS. 3A-3G, one illustrative embodiment of a replacement gate process is performed to form the final gate structure for the device 100 within the gate cavity 103. FIG. 3A schematically depicts the novel device 100 at a point in fabrication wherein several process operations have been performed prior to the actual steps of forming the replacement gate. First, a plurality of fin-formation trenches 114 were formed in a semiconductor substrate 112 by performing at least one etching process through a patterned hard mask layer (not shown), e.g., a patterned layer of silicon nitride. The etching process results in the formation of a plurality of spaced-apart fins 116. Thereafter, the patterned masking layer was removed and a layer of insulating material 118 was deposited on the substrate 112 so as to over-fill the fin-formation trenches 114. Then, a chemical mechanical polishing (CMP) process was performed so as to planarize the upper surface of the layer of insulating material 118 with the upper surface of the fins 116. Thereafter, an etch-back process was performed on the layer of insulating material 118 to recess its upper surface 118S, which exposes the fins 116 to their final desired fin height. As noted above, a dummy gate structure (not shown) was formed above the fins 116 and various process operations were performed on the device with the dummy gate structure in place, e.g., formation of spacers 101 (see FIG. 2) adjacent the dummy gate structure, the formation of source/drain regions, etc. FIGS. 3A-3G depict the device at a point in the process flow wherein the dummy gate structure has been removed to define the gate cavity 103 shown in FIG. 2 and wherein various layers of material will be formed in the gate cavity 103 as part of the replacement gate process.

The substrate 112 may have a variety of configurations, such as a bulk substrate configuration, or it may be the active layer of a silicon-on-insulator (SOI) substrate. The substrate 112 may be made of silicon or it may be made of materials other than silicon. Thus, the terms "substrate" or "semiconductor substrate" should be understood to cover all semiconducting materials and all forms of such materials. Additionally, the overall size, shape and configuration of the fin-formation trenches 114 and the fins 116 may vary depending on the particular application. In one illustrative embodiment, based on current-day technology, the depth of the fin-formation trenches 114 may range from approximately 30-200 nm and the width of the fin-formation trenches 114 may range from about 20-50 nm. In some embodiments, the fins 116 may have a width within the range of about 5-30 nm and a height that corresponds to the depth of the fin-formation trenches 114. In the illustrative examples depicted in the attached drawings, the fin-formation trenches 114 and fins 116 are all depicted as having a uniform size, shape and spacing. However, as discussed more fully below, such uniformity in the size and shape of the fin-formation trenches 114 and the fins 116 is not required to practice at least some aspects of the inventions disclosed herein. In the attached figures, the fin-formation trenches 114 are depicted as having been formed by performing an anisotropic etching process that results in the fin-formation trenches 114 having a schematically depicted, generally rectangular configuration. In an actual real-world device, the sidewalls of the fin-formation trenches 114 may be somewhat inwardly tapered and the fins 116 may have a tapered cross-sectional configuration, although that configuration is not depicted in the attached drawings. In some cases, the fin-formation trenches 114 may have a reentrant profile (not shown) near the bottom of the fin-formation trenches 114. To the extent the fin-formation trenches 114 are formed totally or in part by performing a wet etching process, the fin-formation trenches 114 may tend to have a more rounded configuration or non-linear configuration as compared to the generally rectangular configuration of the fin-formation trenches 114 that are formed by performing an anisotropic etching process. Thus, the size and configuration of the fin-formation trenches 114, and the manner in which they are made, as well as the general cross-sectional configuration of the fins 116, should not be considered a limitation of the presently disclosed inventions. For ease of disclosure, only the substantially rectangular fin-formation trenches 114 and substantially rectangular shaped fins 116 will be depicted in the subsequent drawings. The layer of insulating material 118 may be comprised of a variety of different materials, such as silicon dioxide, doped silicon dioxide (doped with carbon, boron or phosphorous), etc., and it may be initially formed by performing a variety of techniques, e.g., chemical vapor deposition (CVD), etc.

Figure 3B:
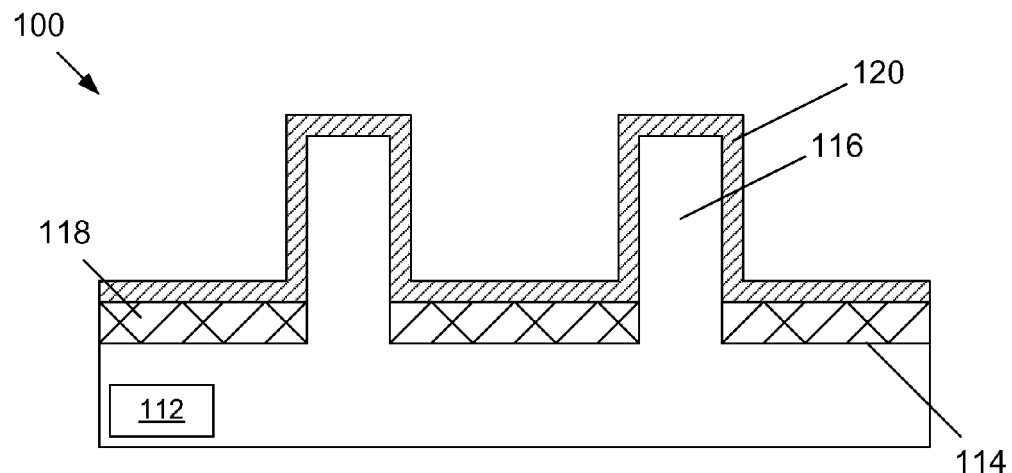

FIG. 3B depicts the device 100 after a layer of gate insulation material 120 has been deposited above the device 100. The layer of gate insulation material 120 may be comprised of a variety of different insulating materials, e.g., silicon dioxide, nitride silicon dioxide, materials having a dielectric constant greater than about 4 including, but not limited to, so-called high-k insulating materials (k value greater than 10), hafnium oxide, hafnium-based dielectrics, lanthanum oxide, aluminum oxide, zirconium oxide and other rare earth oxides, etc. The thickness of the gate insulation material 120 may also vary depending upon the particular application, e.g., from less than 1 nm to somewhat greater than 3 nm, and it may be formed by performing known deposition techniques, e.g., chemical vapor deposition (CVD) processes, atomic layer deposition (ALD) processes, plasma-enhanced versions of such processes, etc., while taking care to form the gate insulation material to a substantially uniform thickness on the sides of the fin and the top of the fin in view of the 3D structure of the FinFET device.

Figure 3C:
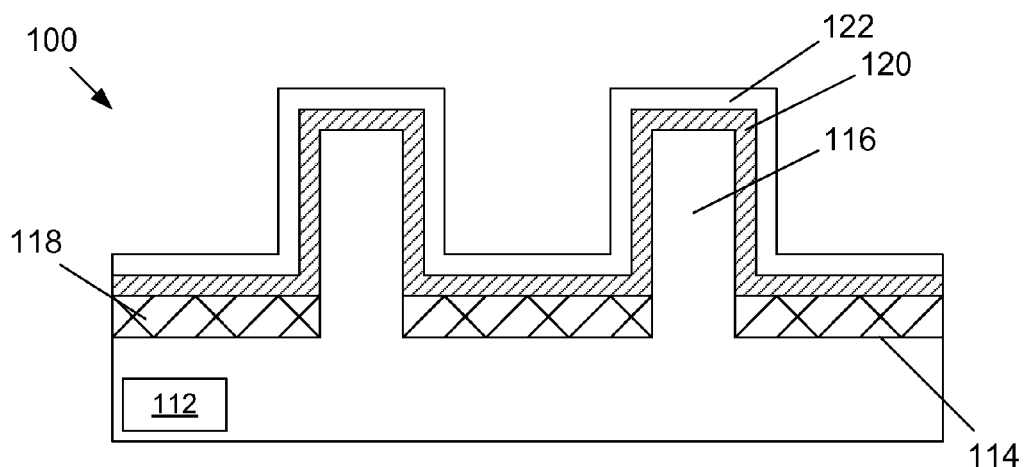

FIG. 3C depicts the device 100 after a work-function adjusting metal layer 122 was deposited on the gate insulation material 120. The work-function adjusting metal layer 122 may be comprised of a variety of different work-function adjusting metals, the selection of which may vary depending upon the type of device 100 being fabricated, e.g., TiN or TaN for P-type devices, TiC or TiAl or TaC for N-type devices, etc. The thickness of the work-function adjusting metal layer 122 may also vary depending upon the particular application, e.g., 2-5 nm, and it may be formed by performing known deposition techniques, e.g., chemical vapor deposition (CVD) processes, atomic layer deposition (ALD) processes, plasma-enhanced versions of such processes, etc., while taking care to form the work-function adjusting metal layer 122 to a substantially uniform thickness adjacent the sides of the fin and the top of the fin in view of the 3D structure of the FinFET device.

Figure 3D:
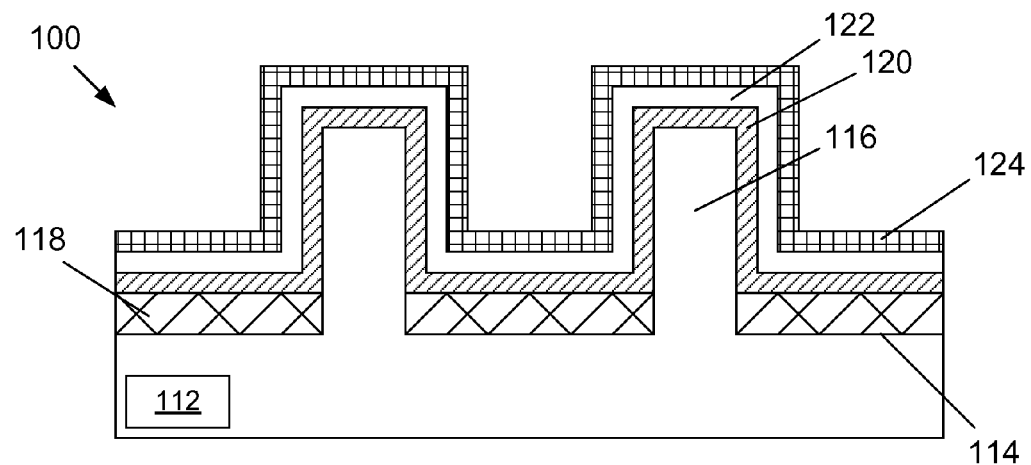

FIG. 3D depicts the device 100 after a stressed conductive material layer 124 was deposited on the work-function adjusting metal layer 122. In one illustrative embodiment, the stressed conductive material layer 124 may be made of a metal, such as a layer of substantially fluorine-free tungsten, etc. The thickness of the stressed conductive material layer 124 may also vary depending upon the particular application, e.g., 3-5 nm. The stressed conductive material layer 124 may be formed so as to exhibit either a tensile or compressive stress depending upon the particular application. In one illustrative embodiment, the stressed conductive material layer 124 may be formed so as to exhibit a compressive stress, and it may be formed by performing an atomic layer deposition process to form a substantially fluorine-free tungsten (FFW) film using plasma or thermal based processes. In the case of plasma-ALD, the typical process scheme is cyclic: (1) fluorine-free tungsten precursor dose; and (2) hydrogen dose and/or NH3 plasma dose to reduce the tungsten based precursor, where the temperature of the pedestal may be about 150-250° C. and the plasma power may be about 100-600 W. In one particularly illustrative embodiment, the stressed conductive material layer 124 may be formed so as to exhibit a compressive stress that falls within the range of −1 to −3 GPa.

Figure 3E:
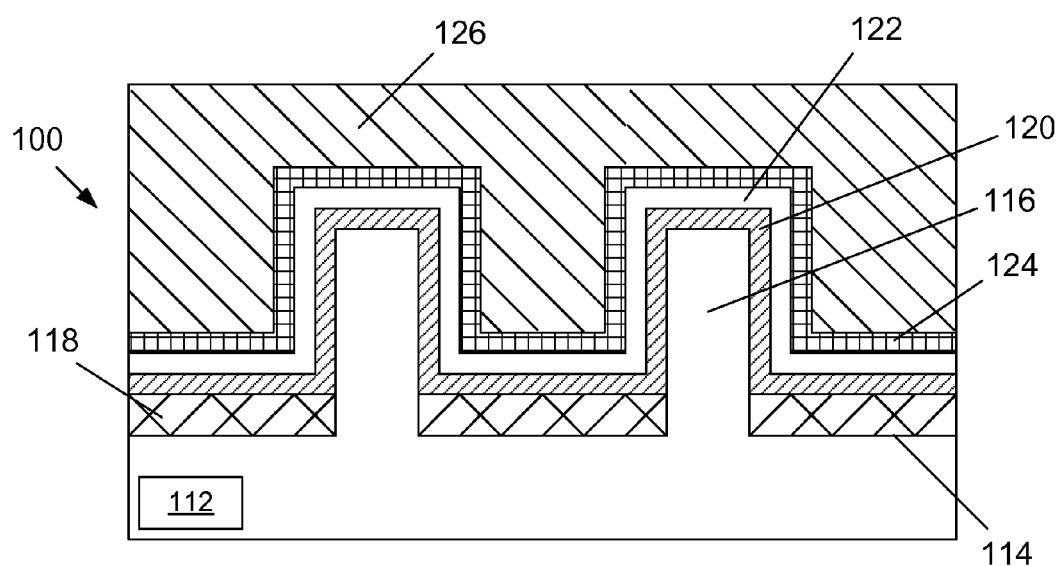

FIG. 3E depicts the device 100 after another stressed conductive material layer 126 was deposited above the stressed conductive material layer 124 so as to over-fill the remaining space between the fins 116. In one illustrative embodiment, the stressed conductive material layer 126 may be made of a metal, such as a layer of tungsten, etc. The stressed conductive material layer 126 may be formed so as to exhibit either a tensile or compressive stress depending upon the particular application. The stressed conductive material layers 124, 126 may also be made of the same or different materials. In one illustrative embodiment, the stressed conductive material layer 126 may be formed so as to exhibit a tensile stress and it may be formed by performing a chemical vapor deposition (CVD) process or a plasma-enhanced CVD process using $WF_6$ so as to form a fluorine-containing tensile-stressed material layer 126. The stressed conductive material layer 126 may be comprised of tungsten and it may be formed by depositing tungsten at a relatively low pedestal temperature, e.g., less than about 300° C., and CVD reduction of $WF_6$ and $H_2/N_2$. In one particularly illustrative embodiment, the stressed conductive material layer 126 may be formed so as to exhibit a tensile stress that falls within the range of +1 to +3.5 GPa. Note that, in one illustrative embodiment, the combined amount of stress from the layers 124, 126 can be optimized to have an effective compressive stress in the space between the fins 116.

Figure 3F:
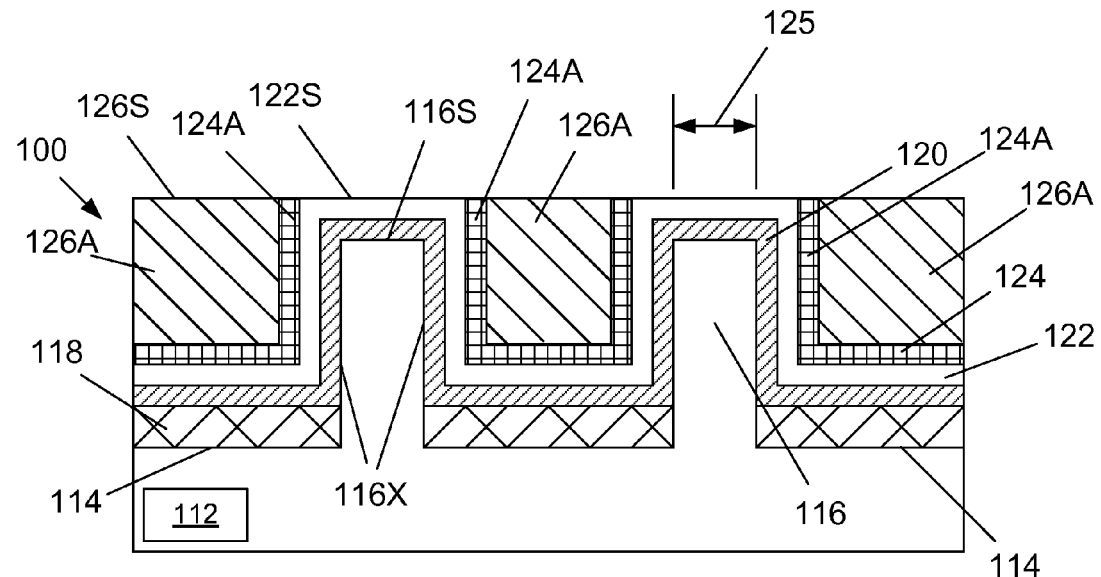

FIG. 3F depicts the device 100 after an etch-back etching process was performed on the stressed conductive material layer 126 and portions of the stressed conductive material layer 124. In one illustrative embodiment, the etch-back process was performed until such time as the upper surface 126S of the stressed conductive material layer 126 is recessed enough to expose at least the upper surface 122S of the work-function adjusting material layer 122. In the depicted example, this results in the formation of spaced-apart portions 126A of the stressed conductive material layer 126 and clears a region 125 above the upper surface 116S of the fin 116 of the material of the stressed conductive material layer 124. The region 125 may be at least as wide as the upper surface 116S of the fin 116, and in many cases wider than the upper surface 116S of the fin 116. However, the amount of recessing may vary depending upon the particular application, e.g., the stressed conductive material layer 126 may be recessed to a deeper level than that depicted in FIG. 3F if desired. Importantly, in the depicted example, this etch-back process removes a portion of the stressed conductive material layer 124 positioned directly above the top surface 116S of the fins 116 while leaving other spaced-apart portions 124A of the stressed conductive material layer 124 positioned at least partially in the trenches 114 adjacent to the sidewalls 116X of the fins 116. Note the generally "U" shaped portion 124A of the stressed conductive material layer 124 positioned between the adjacent fins 116, and the generally "L" shaped portions 124A of the stressed conductive material layer 124 positioned adjacent the outside of the fins 116. As depicted, the stressed conductive material 124 does not actually contact the fins 116. In one illustrative embodiment, this etch-back process may be performed using the processes and techniques disclosed in U.S. Pat. No. 8,124,531, which is hereby incorporated by reference in its entirety. This etch-back process also defines spaced-apart portions of the stressed conductive material layer 126 that are positioned on opposite sides of the fins 116 within the gate cavity 103.

Figure 3G:
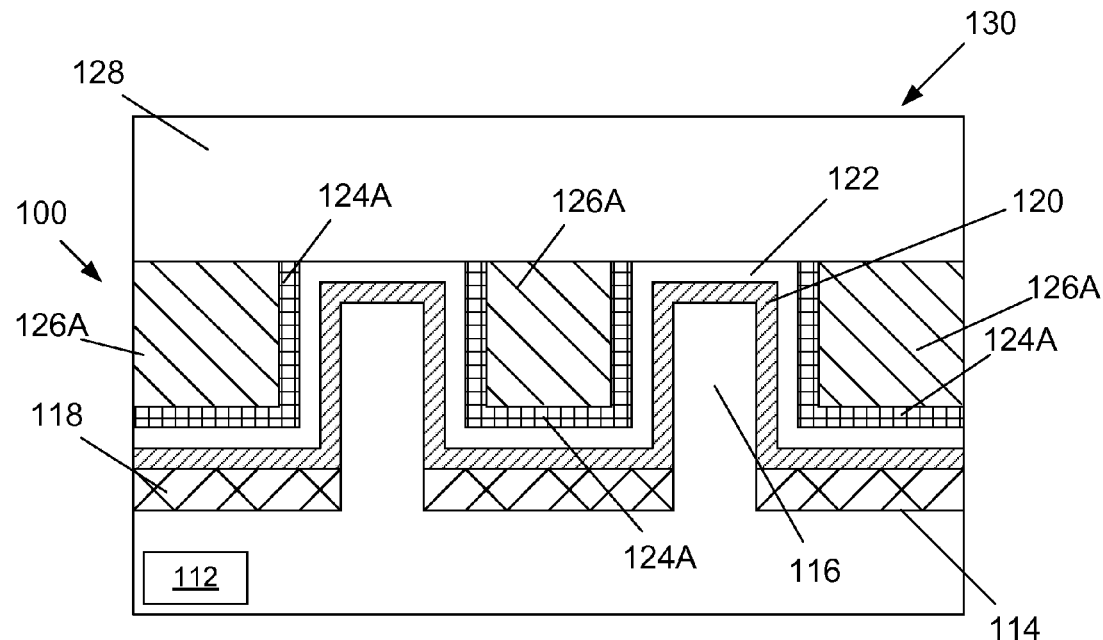

FIG. 3G depicts the device 100 after a conductive material layer 128 was deposited above the structure depicted in FIG. 3F. The thickness of the conductive material layer 128 may also vary depending upon the particular application, e.g., 20-30 nm. In one illustrative embodiment, the conductive material layer 128 may be a metal, such as a layer of tungsten, aluminum, cobalt, etc. The conductive material layer 128 may be formed so as to exhibit either a tensile, compressive or substantially neutral stress. The conductive material layer 128 may be comprised of the same material as one of the stressed conductive material layers 124, 126, or they may all three be made of different materials. The conductive material layer 128 may be formed by performing a chemical vapor deposition (CVD) process or a plasma-enhanced CVD process. In one illustrative embodiment, the conductive material layer 128 may be formed so as to exhibit a tensile stress that falls within the range of +1 to +3.5 GPa. The various layers of material shown in FIG. 3G depict one illustrative example of a final replacement metal gate structure 130 disclosed herein. At this point, traditional manufacturing techniques may be performed to complete the manufacture of the product 100. For example, contacts and metallization layers may then be formed above the device 100 using traditional techniques.

As will be appreciated by those skilled in the art after a complete reading of the present application, the novel methods disclosed herein provide device designers with several options of forming various novel FinFET device structures. In general, the stressed conductive material layers 124, 126 may be formed so as to exhibit different types of stresses and/or different stress magnitudes although they both have the same type of stress. The stressed conductive material layers 124, 126 may also be formed of the same or different materials. It is, therefore, evident that the particular embodiments disclosed above may be altered or modified and all such variations are considered within the scope and spirit of the invention. Note that the use of terms such as "first," "second," "third" or "fourth" to describe various processes, structures or layers in this specification and in the attached claims is only used as a shorthand reference to such steps/structures/layers and does not necessarily imply that such steps/structures/layers are performed/formed in that ordered sequence.

For example, in one illustrative embodiment, the stressed conductive material layers 124, 126 may be conductive materials that are formed so as to have opposite type stresses, e.g., one layer being compressively stressed while the other layer exhibits a tensile stress, or vice-versa. Thus, one illustrative method disclosed herein involves forming a plurality of fin-formation trenches 114 in the substrate 112 so as to define a fin 116 having an upper surface 116S and sidewalls 116X, forming a first stressed conductive material layer 124 having a first type of stress within the trenches 116 and above the upper surface 116S of the fin 116, forming a second stressed conductive material layer 126 above the first stressed conductive material layer 124 and within the trenches 114, wherein the second stressed conductive material layer 126 has a second type of stress that is opposite to the first type of stress, performing at least one etching process (See FIG. 3F) to remove a portion of the second stressed conductive material layer 126 and a portion of the first stressed conductive material layer 124 that is positioned above the upper surface 116S of the fin 116 while leaving portions 124A of the first stressed conductive material layer 124 positioned at least partially within the trenches 114. This etching process also results in the formation of spaced-apart portions 126A of the second stressed conductive material layer 126. The method also includes the step of, after performing the etching process, forming a conductive layer 128 above the spaced-apart portions 124A of the second stressed conductive material layer 124, the upper surface 116S of the fins 116 and the spaced-apart portions 126A of the second stressed conductive material layer 126 positioned at least partially within the trenches 114. In one illustrative example, the stressed conductive material layer 124 may be formed so as to exhibit a compressive stress and the stressed conductive material layer 126 may be formed so as to exhibit a tensile stress. In some applications, the first and second stressed conductive material layers 124, 126 may be formed of metal, and they may be formed of the same or different metal materials.

On illustrative device disclosed herein includes a substrate 112 comprised of a plurality of spaced-apart fin-formation trenches 114 that define a fin 116 having an upper surface 116S and sidewalls 116X, spaced-apart portions 124A of a first stressed conductive material layer 124 that has a first type of stress that are positioned at least partially in the spaced-apart fin-formation trenches 114 adjacent the sidewalls 116S of the fin 116, wherein the spaced-apart portions 124A of the first stressed conductive material layer 124 define a lateral region 125 above the upper surface 116S of the fin 116 that is clear of the first stressed conductive material layer 124 and a second stressed conductive material layer 126 positioned above at least a portion of the lateral region 125, wherein the second stressed conductive material layer 126 has a second type of stress that is opposite to the first type of stress.

As another broad example of the methods disclosed herein, in one illustrative embodiment, the stressed conductive material layers 124, 126 may be formed so as to exhibit the same type of stress, e.g., both exhibiting a tensile stress or both exhibiting a compressive stress. In more detailed embodiments, the stressed conductive material layers 124, 126 may be formed so as to exhibit the same type of stress, but the conductive material layers 124, 126 have different magnitudes of stress. In one very specific example, the absolute value of the difference in stress magnitude between the stressed conductive material layers 124, 126 having the same type of stress may be at least equal to 300 MPa. Thus, one illustrative method disclosed herein involves forming a plurality of fin-formation trenches 114 in the substrate 112 so as to define a fin 116 having an upper surface 116S and sidewalls 116X, forming a first stressed conductive material layer 124 having a first type of stress within the trenches 116 and above the upper surface 116S of the fin 116, forming a second stressed conductive material layer 126 above the first stressed conductive material layer 124 and within the trenches 114, wherein the second stressed conductive material layer 126 also has the same first type of stress, performing at least one etching process (See FIG. 3F) to remove a portion of the second stressed conductive material layer 126 and a portion of the first stressed conductive material layer 124 that is positioned above the upper surface 116S of the fin 116 while leaving portions 124A of the first stressed conductive material layer 124 positioned at least partially within the trenches 114. This etching process also results in the formation of spaced-apart portions 126A of the second stressed conductive material layer 126. The method also includes the step of, after performing the etching process, forming a conductive layer 128 above the spaced-apart portions 124A of the second stressed conductive material layer 124, the upper surface 116S of the fins 116 and the spaced-apart portions 126A of the second stressed conductive material layer 126 positioned at least partially within the trenches 114. In one illustrative example, the first and second stressed conductive material layers 124, 126 may both be formed so as to exhibit a compressive stress. In another embodiment, the first and second stressed conductive material layers 124, 126 may be formed so as to exhibit a tensile stress. In some applications, the first and second stressed conductive material layers 124, 126 may be formed of metal, and they may be formed of the same or different metal materials.

One illustrative device disclosed herein includes a substrate 112 comprised of a plurality of spaced-apart fin-formation trenches 114 that define a fin 116 having an upper surface 116S and sidewalls 116X, spaced-apart portions 124A of a first stressed conductive material layer 124 that has a first type of stress that are positioned at least partially in the spaced-apart fin-formation trenches 114 adjacent the sidewalls 116S of the fin 116, wherein the spaced-apart portions 124A of the first stressed conductive material layer 124 define a lateral region 125 above the upper surface 116S of the fin 116 that is clear of the first stressed conductive layer 124 and a second stressed conductive material layer 126 positioned above at least a portion of the lateral region 125, wherein the second stressed conductive material layer 126 also exhibits the first type of stress.

FIGS. 4A-4G depict another illustrative method disclosed herein for forming stressed fin channel structures for FinFET semiconductor devices and to an illustrative example of a FinFET device having such a stressed fin channel structure.

Figure 4A:
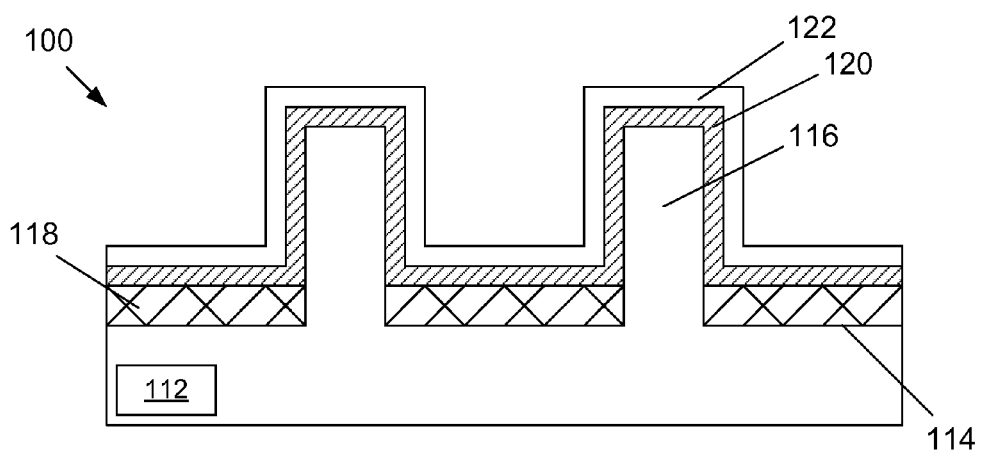
FIGS. 4A-4G depict another illustrative method disclosed herein for forming stressed fin channel structures for FinFET semiconductor devices and another illustrative example of a FinFET device comprised of such a stressed fin channel structure.

FIG. 4A depicts the product 100 at a point of fabrication that corresponds to that depicted in FIG. 3C, i.e., after the layer of gate insulation material 120 and the work-function adjusting material layer 122 have been formed within the gate cavity 103 of this embodiment of the device 100.

Figure 4B:
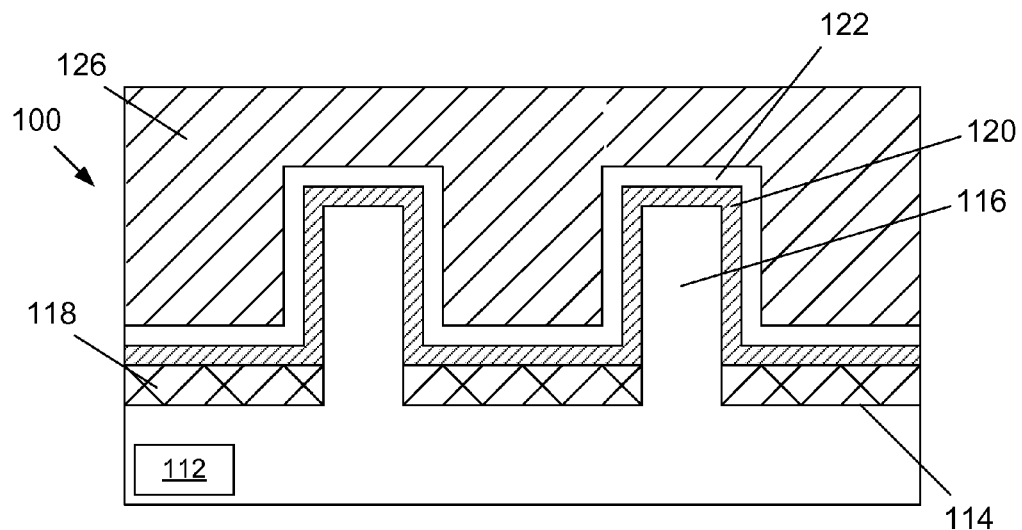

FIG. 4B depicts the device 100 after the above-described stressed conductive material layer 126 was deposited above the work-function adjusting material layer 122 so as to overfill the remaining space between the fins 116. Note that in the case where the stressed conductive material layer 126 is a layer of CVD tungsten, the underlying work-function adjusting material layer 122 should be a barrier to $WF_6$ and should act as a good adhesion layer. If not, an additional adhesion layer (not shown) may need to be deposited prior to the CVD tungsten deposition.

Figure 4C:
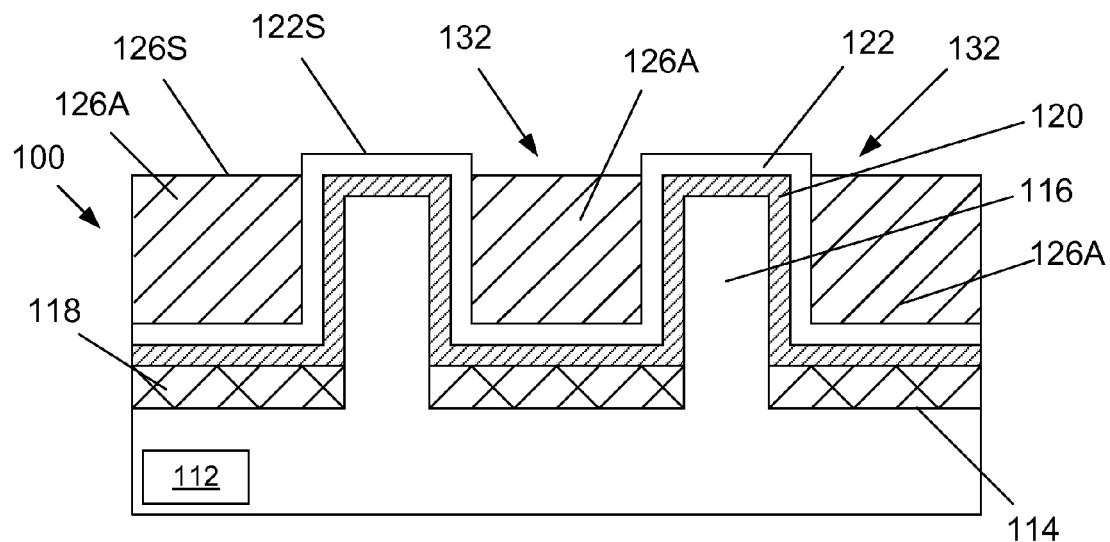

FIG. 4C depicts the device 100 after an etch-back etching process was performed on the stressed conductive material layer 126. In one illustrative embodiment, the etch-back process was performed until such time as the upper surface 126S of the stressed conductive material layer 126 was recessed enough to expose at least the upper surface 122S of the work-function adjusting material layer 122 and define a cavity 132 between the exposed portions of the work-function adjusting material layer 122. The depth of the recess 132 relative to the upper surface 122S of the work-function adjusting material layer 122 may vary depending upon the particular application, e.g., 2-5 nm. In one illustrative embodiment, this etch-back process may be performed using the processes and techniques disclosed in U.S. Pat. No. 8,124,531, which is hereby incorporated by reference in its entirety. In one illustrative embodiment, where the stressed conductive material layer 126 is comprised of tungsten, a halide-based etchant, e.g., $NF_3$, $CF_4$, $C_2F_4$, $C_2F_6$, $SF_6$, or $F_2$, may be used with RF plasma (200-900 W) to generate fluorine radicals, ions and/or high energy molecules. The fluorine-based particles etch tungsten to form volatile $WF_6$. The etch time is optimized to etch the desirable amount of tungsten within the trench. The temperature of the pedestal can be changed (e.g., 40-200° C.) to optimize the etch selectivity between the tungsten film and the work function metals. Furthermore, the flow of the etchant gases may be varied (e.g., 20-100 sccms) and controlled to change the conformality of the etch process.

Figure 4D:
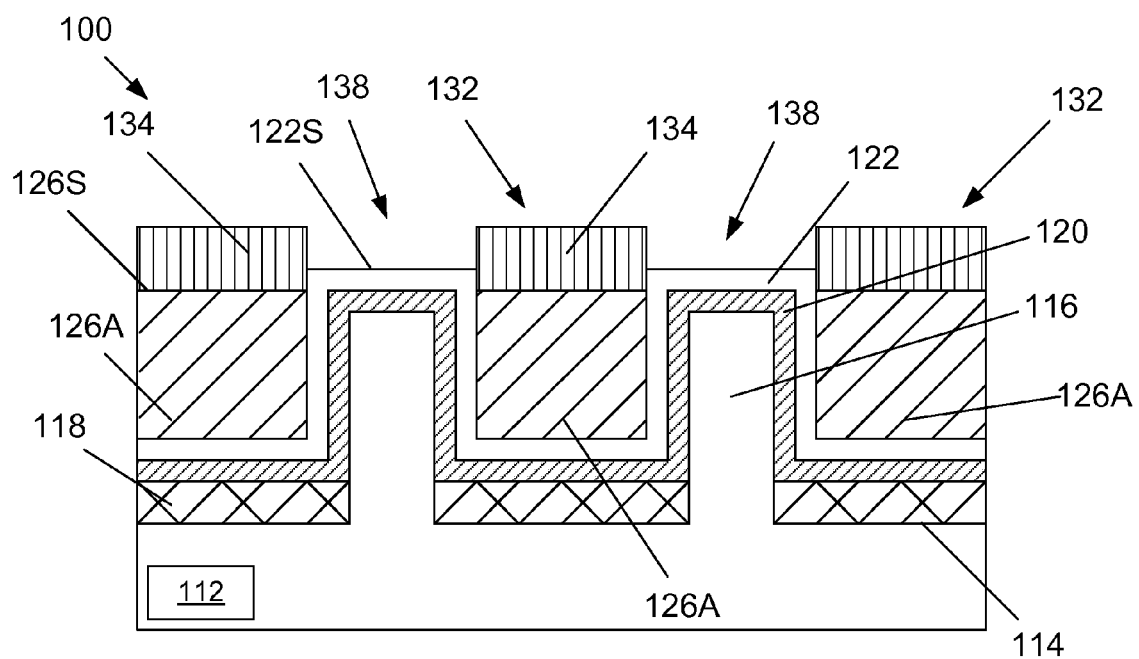

FIG. 4D depicts the device 100 after a stressed conductive material layer 134 was selectively deposited above the stressed conductive material layer 126A in the cavities 132 using a "bottom-up" type of deposition process. The formation of the spaced-apart portions of the stressed conductive material layer 134 results in the definition of a plurality of cavities 138 between the spaced-apart portions of the stressed conductive material layer 134. The stressed conductive material layer 134 may be formed so as to exhibit either a tensile or compressive stress. The stressed conductive material layer 134 may be comprised of the same material of one of the stressed layers 124, 126, or they may all three be made of the same material or different materials. In one illustrative embodiment, the stressed conductive material layer 134 may be made of a metal, such as a layer of a CVD tungsten, e.g., a fluorine-containing tungsten, etc. The thickness of the selectively-deposited stressed conductive material layer 134 may also vary depending upon the particular application, e.g., 5-10 nm. In one illustrative embodiment where the stressed conductive material layer 126 is formed so as to exhibit a tensile stress, the stressed conductive material layer 134 may be formed so as to also exhibit a tensile stress, although it may have a different stress magnitude. In the case where the stressed conductive material layer 134 is formed so as to exhibit a tensile stress, it may be formed using the processes and techniques disclosed in U.S. Pat. No. 8,124,531, which is hereby incorporated by reference. In one illustrative embodiment, the stressed material layer 134 may be formed so as to exhibit a tensile stress that falls within the range of +1 to +3.5 GPa.

Figure 4E:
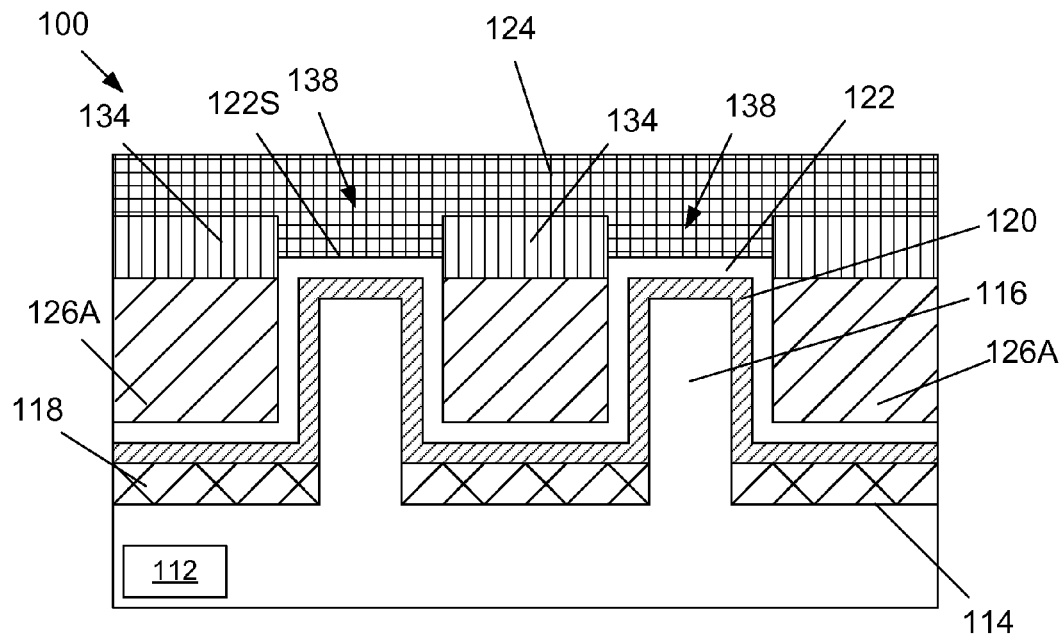

FIG. 4E depicts the device 100 after the above-described stressed conductive material layer 124 was deposited above the device 100 so as to over-fill the cavities 138.

Figure 4F:
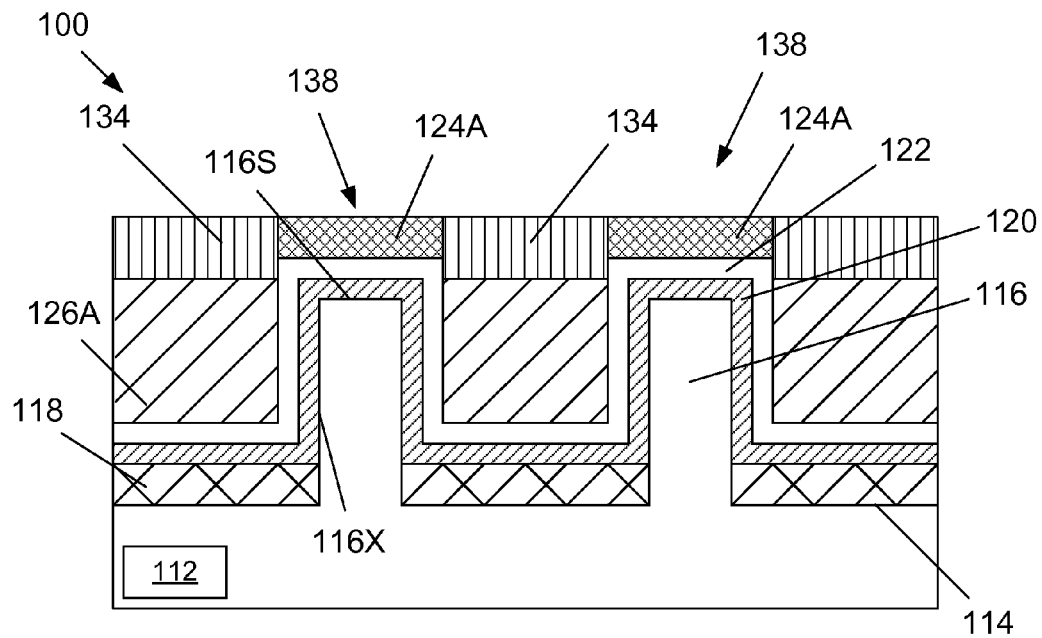

FIG. 4F depicts the device 100 after an etch-back etching process was performed on the stressed conductive material layer 124 so as to thereby define spaced apart portions 124A of the stressed conductive material layer 124 that are positioned above the upper surface 116S of the fins 116. In one illustrative embodiment, this etch-back process may be performed using the processes and techniques disclosed in U.S. Pat. No. 8,124,531, which is hereby incorporated by reference in its entirety. In one illustrative embodiment, the etch-back process was performed until such time as the upper surfaces of the spaced-apart portions of the stressed conductive material layer 134 are exposed. However, the amount of recessing may vary depending upon the particular application, e.g., the stressed conductive material layer 124 may be recessed to a deeper level than that depicted in FIG. 4F if desired. Importantly, in this embodiment, the spaced apart portions 124A of the stressed conductive material layer 124 are positioned directly above the top surface 116S of the fins 116, while the stressed conductive material layers 126, 134 are positioned adjacent to the sidewalls 116X of the fins 116 but they are not located directly above the upper surface of the fins 116.

Figure 4G:
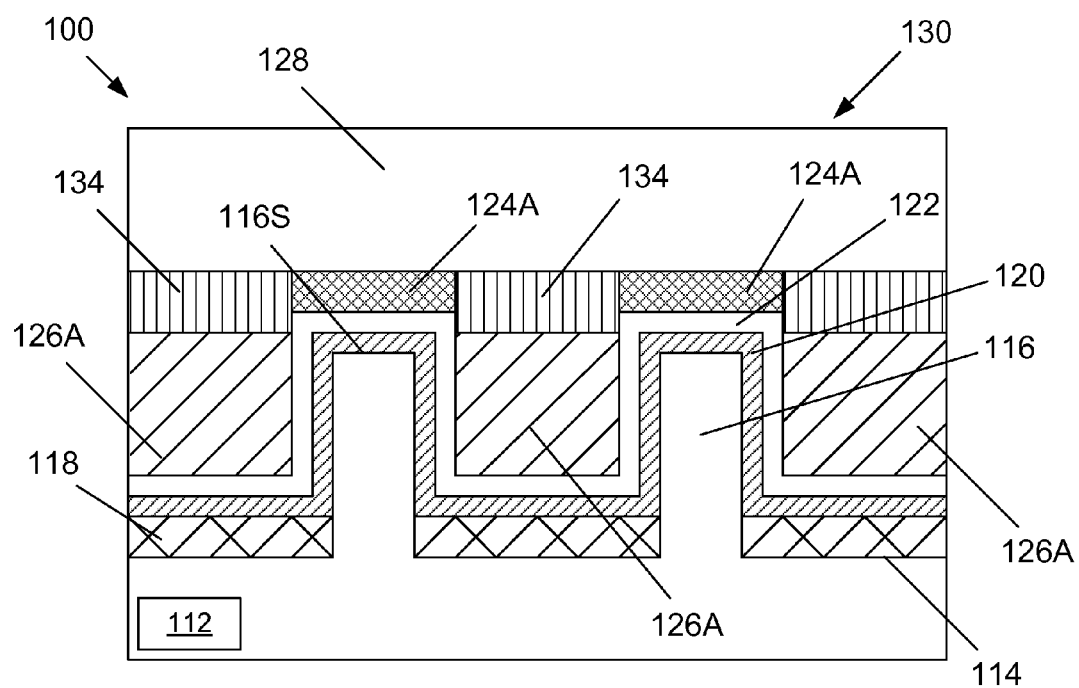

FIG. 4G depicts the device 100 after the above-described conductive material layer 128 was deposited above the structure depicted in FIG. 4F. The various layers of material shown in FIG. 4G depict another illustrative example of a final replacement metal gate structure 130 disclosed herein. At this point, traditional manufacturing techniques may be performed to complete the manufacture of the product 100. For example, additional contacts and metallization layers may then be formed above the device 100 using traditional techniques.

As will be appreciated by those skilled in the art after a complete reading of the present application, the novel methods disclosed in FIGS. 4A-4G herein also provide device designers with several options of forming various novel FinFET device structures. As before, in the embodiment shown in FIGS. 4A-4G, the stressed conductive material layers 124, 126 may be formed so as to exhibit different types of stresses and/or different stress magnitudes although they both have the same type of stress. The stressed conductive material layer 134 may also be formed so as to exhibit the same type of stress as the stressed conductive material layer 126, although these two layers may exhibit different magnitudes of the same type stress. The stressed conductive material layers 124, 126, 134 may also be formed of the same or different conductive materials. Note that, as before, the use of terms such as "first," "second," "third" or "fourth" to describe various processes, structures or layers in this specification and in the attached claims is only used as a shorthand reference to such steps/structures/layers and does not necessarily imply that such steps/structures/layers are performed/formed in that ordered sequence.

Thus, another illustrative method disclosed herein includes forming a plurality of fin-formation trenches 114 in the substrate 112 so as to define a fin 116 having an upper surface 116S and sidewalls 116X, forming a first stressed conductive material layer 126 having a first type of stress within the trenches 114 and above the upper surface 116S of the fin 116, performing at least one etching process (see FIG. 4C) on the first stressed conductive material layer 126 so as to define spaced-apart portions 126A of the first stressed conductive material layer 126 that are positioned at least partially within the trenches 114 on opposite sides of the fin 116, after performing the etching process, performing a selective deposition process to selectively form spaced-apart portions of a second stressed conductive material layer 134 above the spaced-apart portions 126A of the first stressed conductive material layer 126, wherein the second stressed conductive material layer 134 has a stress that is the same as the first type of stress, forming a third stressed conductive material layer 124 (comprised of spaced-apart portions 124A) above the upper surface 116S of the fin 116 between the spaced-apart portions 134 of the second stressed conductive material layer, wherein the third stressed conductive material layer 124 has a type of stress that is opposite to the first type of stress, and, after forming the third stressed conductive material layer 124, forming a fourth conductive layer 128 above the second and third stressed conductive material layers.

Yet another illustrative device disclosed herein includes a substrate 112 comprised of a plurality of spaced-apart fin-formation trenches 114 that define a fin 116 having an upper surface 116S and sidewalls 116X, spaced-apart portions 126A of a first stressed conductive material layer 126 having a first type of stress that are positioned at least partially in the spaced-apart fin-formation trenches 114 adjacent the sidewalls 116X of the fin 116, wherein the spaced-apart portions 126A of the first stressed conductive material layer 126 define a lateral region above the upper surface of the fin that is clear of the first conductive material layer, spaced-apart portions 134 of a second stressed conductive material layer having the first type of stress, each of which are positioned above one of the spaced-apart portions 126A of the first stressed conductive material layer 126, wherein the spaced-apart portions 134 of the second stressed conductive material layer define a recess 138 positioned above at least a portion of the upper surface 116S of the fin 116, and a third stressed conductive material layer 124A positioned at least partially in the recess 138, wherein the third stressed conductive material layer 124A has a second type of stress that is opposite to the first type of stress.

FIGS. 4A-4G also depict various methods disclosed herein in which the stressed conductive material layers 124, 126 may be formed so as to exhibit the same type of stress, e.g., both exhibiting a tensile stress or both exhibiting a compressive stress. In more detailed embodiments, the stressed conductive material layers 124, 126 may be formed so as to exhibit the same type of stress, but the conductive material layers 124, 126 have different magnitudes of stress. In one very specific example, the absolute value of the difference in stress magnitude between the stressed conductive material layers 124, 126 having the same type of stress may be at least equal to 300 MPa. The stressed conductive material layer 134 may also be formed so as to exhibit the same type of stress as the layers 124, 126, but its stress level may be different in magnitude relative to at least one of the layers 124, 126.

Thus, another illustrative method disclosed herein includes forming a plurality of fin-formation trenches 114 in the substrate 112 so as to define a fin 116 having an upper surface 116S and sidewalls 116X, forming a first stressed conductive material layer 126 having a first type of stress within the trenches 114 and above the upper surface 116S of the fin 116, performing at least one etching process (see FIG. 4C) on the first stressed conductive material layer 126 so as to define spaced-apart portions 126A of the first stressed conductive material layer 126 that are positioned at least partially within the trenches 114 on opposite sides of the fin 116, after performing the etching process, performing a selective deposition process to selectively form spaced-apart portions of a second stressed conductive material layer 134 above the spaced-apart portions 126A of the first stressed conductive material layer 126, wherein the second stressed conductive material layer 134 has a stress that is the same as the first type of stress, forming a third stressed conductive material layer 124 (comprised of spaced-apart portions 124A) above the upper surface 116S of the fin 116 between the spaced-apart portions 134 of the second stressed conductive material layer, wherein the third stressed conductive material layer 124 also is formed so as to exhibit the first type of stress, and, after forming the third stressed conductive material layer 124, forming a fourth conductive layer 128 above the second and third stressed conductive material layers.

Yet another illustrative device disclosed herein includes a substrate 112 comprised of a plurality of spaced-apart fin-formation trenches 114 that define a fin 116 having an upper surface 116S and sidewalls 116X, spaced-apart portions 126A of a first stressed conductive material layer 126 having a first type of stress that are positioned at least partially in the spaced-apart fin-formation trenches 114 adjacent the sidewalls 116X of the fin 116, wherein the spaced-apart portions 126A of the first stressed conductive material layer 126 define a lateral region above the upper surface of the fin that is clear of the first conductive material layer, spaced-apart portions 134 of a second stressed conductive material layer having the first type of stress, each of which are positioned above one of the spaced-apart portions 126A of the first stressed conductive material layer 126, wherein the spaced-apart portions 134 of the second stressed conductive material layer define a recess 138 positioned above at least a portion of the upper surface 116S of the fin 116, and a third stressed conductive material layer 124A positioned at least partially in the recess 138, wherein the third stressed conductive material layer 124A is also formed so as to exhibit said first type of stress.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes, structures or layers in this specification and in the attached claims is only used as a shorthand reference to such steps/structures/layers and does not necessarily imply that such steps/structures/layers are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
    forming a plurality of fin-formation trenches in a semiconductor substrate, said fin-formation trenches defining a fin having an upper surface;
    forming a first stressed conductive material layer within said trenches and above said upper surface of said fin;
    performing at least one etching process on said first stressed conductive material layer so as to define spaced-apart portions of said first stressed conductive material layer positioned at least partially within said trenches on opposite sides of said fin;
    after performing said etching process, performing a selective deposition process to selectively form spaced-apart portions of a second stressed conductive material layer above said spaced-apart portions of said first stressed conductive material layer;
    forming a third stressed conductive material layer above said upper surface of said fin between said spaced-apart portions of said second stressed conductive material layer; and
    after forming said third stressed conductive material layer, forming a conductive layer above said second stressed conductive material layer and said third stressed conductive material layer.

2. The method of claim 1, wherein said first stressed conductive material layer and said second stressed conductive material layer are formed so as to exhibit a first type of stress and said third stressed conductive material layer is formed so as to exhibit a second type of stress that is opposite to said first type of stress.

3. The method of claim 1, wherein said first stressed conductive material layer, said second stressed conductive material layer and said third stressed conductive material layer are formed so as to exhibit the same type of stress.

4. The method of claim 3, wherein at least one of said first stressed conductive material layer, said second stressed conductive material layer and said third stressed conductive material layer is formed so as to exhibit a different magnitude of said same type of stress as compared to the other two of said first, second and third stressed conductive material layers.

5. The method of claim 4, wherein a difference between said different magnitudes of the same type of stress has an absolute value of at least 300 MPa.

6. The method of claim 1, wherein said first stressed conductive material layer and said second stressed conductive material layer are comprised of different materials.

7. The method of claim 2, wherein said first type of stress is a tensile stress and said second type of stress is a compressive stress.

8. The method of claim 1, wherein said first stressed conductive material layer and said second stressed conductive material layer are comprised of substantially fluorine-free tungsten and said third stressed conductive material layer is a layer of fluorine-containing tungsten.

9. The method of claim 1, wherein said conductive layer is a layer of fluorine-containing tungsten.

10. The method of claim 2, wherein said first stressed conductive material layer is formed so as to have a tensile stress that falls within the range of +1 to +3.5 GPa and said third stressed conductive material layer is formed so as to have a compressive stress that falls within the range of −1 to −3 GPa.

11. The method of claim 1, wherein, prior to forming said first stressed conductive material layer, the method further comprises:
    forming a layer of high-k insulating material on said upper surface of said fin and on sidewalls of said fin; and
    forming a layer of work-function adjusting material on said layer of high-k insulating material and wherein forming said first stressed conductive material layer comprises forming said first stressed conductive material layer on said layer of work-function adjusting material.

12. A method, comprising:
- forming a plurality of fin-formation trenches in a semiconductor substrate, said fin-formation trenches defining a fin having an upper surface;
- forming a first stressed conductive material layer within said trenches and above said upper surface of said fin, said first stressed conductive material layer being formed with a first stress;
- performing at least one etching process on said first stressed conductive material layer so as to define spaced-apart portions of said first stressed conductive material layer positioned at least partially within said trenches on opposite sides of said fin;
- after performing said etching process, performing a selective deposition process to selectively form spaced-apart portions of a second stressed conductive material layer above said spaced-apart portions of said first stressed conductive material layer, said second stressed conductive material layer being formed with a second stress;
- forming a third stressed conductive material layer above said upper surface of said fin between said spaced-apart portions of said second stressed conductive material layer, said third stressed conductive material layer being formed with a third stress; and
- after forming said third stressed conductive material layer, forming a conductive layer above said second stressed conductive material layer and said third stressed conductive material layer.

13. The method of claim 12, wherein said first, second and third stresses are all the same type of stress.

14. The method of claim 12, wherein said first and second stresses are a first type of stress and said third stress is second type of stress that is opposite to said first type of stress.

15. The method of claim 14, wherein said first and third stresses are the same type of stress but of differing magnitude.

16. The method of claim 15, wherein a difference between said differing magnitudes of the same type of stress has an absolute value of at least 300 MPa.

17. The method of claim 12, wherein said first stressed conductive material layer and said third stressed conductive material layer are comprised of different materials.

18. A method, comprising:
- forming a plurality of fin-formation trenches in a semiconductor substrate, said fin-formation trenches defining a fin having an upper surface;
- forming a first stressed conductive material layer comprised of fluorine-containing tungsten within said trenches and above said upper surface of said fin, wherein said first stressed conductive material layer is formed so as to have a tensile stress;
- performing at least one etching process on said first stressed conductive material layer so as to define spaced-apart portions of said first stressed conductive material layer positioned at least partially within said trenches on opposite sides of said fin;
- after performing said etching process, performing a selective deposition process to selectively form spaced-apart portions of a second stressed conductive material layer comprised of fluorine-containing tungsten above said spaced-apart portions of said first stressed conductive material layer, wherein said second stressed conductive material layer is formed so as to have a tensile stress;
- forming a third stressed conductive material layer comprised of substantially fluorine-free tungsten above said upper surface of said fin between said spaced-apart portions of said second stressed conductive material layer, wherein said third stressed conductive material layer is formed so as to have a compressive stress; and
- after forming said third metal layer, forming a conductive layer above said second stressed conductive material layer and said third stressed conductive material layer.

19. The method of claim 18, wherein said conductive layer is a layer of fluorine-containing tungsten.

20. The method of claim 18, wherein said first stressed conductive material layer is formed so as to have a tensile stress that falls within the range of +1 to +3.5 GPa and said third stressed conductive material layer is formed so as to have a compressive stress that falls within the range of −1 to −3 GPa.

21. The method of claim 20, wherein, prior to forming said first stressed conductive material layer, the method further comprises:
- forming a layer of high-k insulating material on said upper surface of said fin and on sidewalls of said fin; and
- forming a layer of work-function adjusting material on said layer of high-k insulating material and wherein forming said first stressed conductive material layer comprises forming said first stressed conductive material layer on said layer of work-function adjusting material.

22. A device, comprising:
- a semiconductor substrate comprised of a plurality of spaced-apart fin-formation trenches that define a fin having an upper surface and sidewalls;
- spaced-apart portions of a first stressed conductive material layer that are positioned at least partially in said spaced-apart fin-formation trenches adjacent said sidewalls of said fin, wherein said spaced-apart portions of said first stressed conductive material layer define a lateral region above said upper surface of said fin that is clear of said first stressed conductive material layer;
- spaced-apart portions of a second stressed conductive material layer, each of which are positioned above one of said spaced-apart portions of said first stressed conductive material layer, wherein said spaced-apart portions of said second stressed conductive material layer define a recess positioned above at least a portion of said upper surface of said fin; and
- a third stressed conductive material layer positioned at least partially in said recess.

* * * * *